(12) United States Patent
Plangger

(10) Patent No.: US 12,295,464 B2
(45) Date of Patent: May 13, 2025

(54) DECORATIVE ARTICLES HAVING A CHANGEABLE OBSERVED COLOUR EFFECT

(71) Applicant: D. Swarovski KG, Wattens (AT)

(72) Inventor: Christoph Plangger, Hatting (AT)

(73) Assignee: D. Swarovski KG, Wattens (AT)

( * ) Notice: Subject to any disclaimer, the term of this patent is extended or adjusted under 35 U.S.C. 154(b) by 185 days.

(21) Appl. No.: 17/753,758

(22) PCT Filed: Sep. 24, 2020

(86) PCT No.: PCT/EP2020/076803
§ 371 (c)(1),
(2) Date: Mar. 14, 2022

(87) PCT Pub. No.: WO2021/058694
PCT Pub. Date: Apr. 1, 2021

(65) Prior Publication Data
US 2022/0369772 A1 Nov. 24, 2022

(30) Foreign Application Priority Data

Sep. 24, 2019 (EP) .................................. 19199393

(51) Int. Cl.
*A44C 27/00* (2006.01)
*A44C 1/00* (2006.01)
(Continued)

(52) U.S. Cl.
CPC .............. *A44C 27/005* (2013.01); *A44C 1/00* (2013.01); *A44C 27/006* (2013.01); *B44F 1/14* (2013.01);
(Continued)

(58) Field of Classification Search
CPC .................................................... A44C 27/005
See application file for complete search history.

(56) References Cited

U.S. PATENT DOCUMENTS 4,793,864 A 12/1988 Neumiller
5,853,826 A 12/1998 Starcke
(Continued)

FOREIGN PATENT DOCUMENTS

CN 105593668 A 5/2016
EP 1479308 A1 11/2004
(Continued)

OTHER PUBLICATIONS

Windy Iris Art, Painting Glass Ornaments Tutorial—Tips and Advice on using Glass Paints, YouTube, Published on Dec. 19, 2015, available at https://www.youtube.com/watch?v=gko1eDA2yvo (Year: 2015).*

(Continued)

*Primary Examiner* — Kyle A Cook
(74) *Attorney, Agent, or Firm* — Stevens & Showalter LLP

(57) ABSTRACT

A decorative article (100) having an observed colour effect that is changeable depending on observer (200) viewing angle, the article comprising: a decorative element (110) comprising a front side (114) facing a forward direction and a back side (112) opposite the front side facing a rearward direction, wherein the back side comprises a back surface (113) having a first region (122) and a second region (124) surrounding the first region; a first coating (132) arranged on the first region of the back surface, the first coating causing a first colour effect (102); and a second coating (134) arranged on the second region of the back surface, the second coating causing a second colour effect (104) that differs from the first colour effect.

12 Claims, 12 Drawing Sheets

(51) Int. Cl.
    *B44F 1/14*     (2006.01)
    *C04B 41/00*     (2006.01)
    *C04B 41/51*     (2006.01)
    *C04B 41/52*     (2006.01)
    *C23C 14/00*     (2006.01)
    *C23C 14/04*     (2006.01)
    *C23C 14/18*     (2006.01)
    *C04B 111/80*     (2006.01)

(52) U.S. Cl.
    CPC ........ *C04B 41/009* (2013.01); *C04B 41/5144* (2013.01); *C04B 41/52* (2013.01); *C23C 14/0015* (2013.01); *C23C 14/042* (2013.01); *C23C 14/18* (2013.01); *C04B 2111/80* (2013.01)

(56) References Cited

U.S. PATENT DOCUMENTS

| | | | |
|---|---|---|---|
| 7,526,928 | B1 | 5/2009 | Kearnes |
| 2011/0026208 | A1 | 2/2011 | Utsuro |
| 2014/0075991 | A1 | 3/2014 | He |
| 2015/0052946 | A1 | 2/2015 | Reid, II |

FOREIGN PATENT DOCUMENTS

| | | |
|---|---|---|
| JP | 2002278043 A | 9/2002 |
| JP | 2005015898 A | 1/2005 |

OTHER PUBLICATIONS

Christopher Radko "Brave Heart" Ornament Commemorating 9/11, Everything but the House, for public sale on May 30, 2017 (Year: 2017).*

Blick Art Materials, Pebeo Vitrea 160 Glass Paints and Sets, Screen shot taken on Sep. 13, 2017, available at https://www.dickblick.com/products/pebeo-vitrea-160-glass-paint/ (Year: 2017).*

Huiyu, Gao; First Office Action dated May 31, 2023; Chinese Application No. 202080066742; China National Intellectual Property Administration; Beijing, China.

Contreras Aparicio; Extended European Search Report; European Application No. 19199393.0; Mar. 25, 2020; European Patent Office; Munich, Germany.

Claudia Aragone; International Search Report and Written Opinion; International Application No. PCT/EP2020/076803; Jan. 20, 2021; Rijswijk, Netherlands.

Huiyu, Gao; Second Office Action dated Mar. 9, 2024; Chinese Application No. 202080066742.8; China National Intellectual Property Administration; Beijing, China.

Huiyu, Gao; Decision of Rejection dated Jul. 10, 2024; Chinese Application No. 2020800667428; China National Intellectual Property Administration; Beijing, China.

* cited by examiner

DECORATIVE ARTICLES HAVING A CHANGEABLE OBSERVED COLOUR EFFECT

FIELD OF THE INVENTION

The present disclosure relates to a decorative article having an observed colour effect that is changeable depending on observer viewing angle, and to a method of making such a decorative article.

BACKGROUND OF THE INVENTION

Decorative elements such as gemstones are commonly used as part of jewellery and for embellishing clothing. For certain uses, it is desirable to use coloured decorative elements.

Sometimes it is necessary to apply a coating to a gemstone so that it appears to an observer to have a particular colour effect. This is because certain colours for gemstones are not found in nature and/or cannot be synthesised in the bulk material of the gemstone. Even if such gemstones are found in nature or can be synthesised in a laboratory, it can be too expensive to obtain some colours in this way.

Two types of colour coating systems are typically used: absorption colour coating systems, and interference colour coating systems.

Absorption colour coating systems employ a coating that absorbs light within a particular wavelength range, such that only light within a particular wavelength range is reflected through the crystal. In this way, the observed colour of the crystal is dictated by the reflected wavelength range. Such absorption colour coating systems have been applied to decorative elements to produce certain monochromatic colour effects.

Interference coatings use interference of light waves to produce colour effects. In its simplest form, an interference coating comprises at least one thin, partially-transparent layer and a reflective layer. A proportion of light is reflected off the partially-transparent layer, and a proportion is transmitted through the partially-transparent layer and reflected off the reflective layer. The two reflected proportions are phase-shifted relative to one another, and thus interfere, resulting in a new observed colour effect. More complex interference coatings may use multiple layers to obtain a particular colour effect.

Interference colour coating systems can be used to achieve multi-colour effects, which can cause decorative elements to appear multi-coloured. For example, the Aurora Borealis effect from Swarovski® uses interference coatings to this effect. However, the multi-coloured effects that these coating systems transmit are unpredictable due to the nature of light wave interference.

As such, there has been a desire to colour decorative elements that produce multi-coloured effects in a more predictable and consistent manner.

For at least some applications, for example when decorative elements are to be incorporated into an article such as a jewellery piece by the high-temperature cast-in-place method, it is desirable to ensure that the coating on the decorative element is resistant to high temperatures. Interference colour systems are often easily damaged when subjected to heat, since interfusion of layers at high temperature affects light reflection and interference, and hence the transmitted colour effects.

The decorative articles and methods according to the present invention aim to solve or at least alleviate one or more of the problems associated with the prior art.

SUMMARY OF THE INVENTION

Against this background, the invention resides in a decorative article having an observed colour effect that is changeable depending on observer viewing angle, the article comprising: a decorative element comprising a front side facing a forward direction and a back side opposite the front side facing a rearward direction, wherein the back side comprises a back surface having a first region and a second region surrounding the first region; a first coating arranged on the first region of the back surface, the first coating causing a first colour effect; and a second coating arranged on the second region of the back surface, the second coating causing a second colour effect that differs from the first colour effect.

By arranging the first and second coatings in this way, the first and second colour effects are each observed differently when the article is viewed from a first viewing angle parallel to the forward direction compared to when the article is viewed from a second viewing angle transverse to the forward direction. Such a decorative article therefore has an observed colour effect which changes reliably and predictably with observer viewing angle.

For example, the first and second colour effects may each be visible to different extents when the article is viewed from a first viewing angle parallel to the forward direction and when the article is viewed from a second viewing angle transverse to the forward direction.

Preferably, the first colour effect is more visible when the article is viewed from a first viewing angle parallel to the forward direction than when the article is viewed from a second viewing angle transverse to the forward direction, and the second colour effect is more visible when the article is viewed from the second viewing angle than when the article is viewed from the first viewing angle.

Preferably, the first colour effect corresponds to a darker colour than the second colour effect. To this end, a colour of the first coating in the first region may be darker than a colour of the second coating in the second region.

The second region surrounding the first region signifies that the second region completely encloses the first region, i.e. that the second region encloses the first region all the way around the first region. In this way, the second region is arranged adjacent to the first region on all sides of the first region. In other words, the first region is bounded by the second region—that is, the first region is surrounded (i.e. on all sides/entirely) by a periphery, the second region bordering (all parts of) the periphery.

The front side and/or the back side may taper towards a tip along a tip axis. In this case, the tip axis may pass through the first region of the back side such that the first region is aligned with the tip.

In one embodiment, the back side tapers towards a tip along the rearward direction. In this embodiment, the first region may be adjacent to the tip and the second region may be remote from the tip. In one preferred embodiment, the first region encompasses the tip of the decorative element. The articles of these embodiments are particularly easily manufactured.

The second coating may beneficially be provided over the first coating in the first region of the back surface. This arrangement of coatings on the decorative element is beneficial as it is particularly easily realised. In this arrangement, it is only the first coating that is applied within a specific region, i.e. the first region, of the back surface of the back side. The second region can then be applied anywhere on the back surface of the back side.

The first and second regions may together cover the entire back surface of the decorative element. In other embodiments, a portion of the back surface may be uncoated, or there may be a third or further region in addition to the first and second regions. The second coating may be applied over the entirety of the back surface of the back side of the decorative element.

The second region may be separated from the first region by a boundary. The boundary may be defined by a perimeter of a planar cross-section of the back side. This arrangement is particularly easily manufactured using a mask.

The planar cross-section may be defined by a plane that is substantially perpendicular to the backward direction and/or the tip axis and the back surface of the back side. This arrangement provides an advantageously symmetrical colour-change effect The plane being substantially perpendicular to the backward direction and/or the tip axis may indicate that an angle between plane and the backward direction and/or the tip axis is between 80° and 100°, and preferably between 85° and 95°. In one particular preferred embodiment, the angle between the plane and the backward direction and/or the tip axis is 90°, i.e. the plane is perpendicular to the backward direction and/or the tip axis.

The back side of the decorative element may be substantially conical. The back side may be substantially circularly conical (i.e. having a circular cross section) or substantially polygonally conical (i.e. having a polygonal cross section, and hence being substantially pyramidal).

The first region may take the shape of the outer surface of a cone (e.g. circular or polygonal) without a base. The second region may take the shape of a frustum (e.g. circular or polygonal) without a top or a base.

The boundary may extend all the way around the outside of the (e.g. conical) back side such that the back surface of the back side is divided up into a first region adjacent to and/or encompassing the tip and a second region remote from the tip.

The decorative element may comprise a middle section that joins the front side and the back side. A diameter of the planar cross-section may be substantially half a diameter of the middle section. This arrangement means that it is not possible to see the boundary between the first and second regions when the decorative article is viewed from a first viewing angle that is aligned with the forward/backward direction and/or the tip axis, which may provide a particularly desirable observed effect. When the diameter of the planar cross-section is substantially smaller than half the diameter of the middle section, the boundary between the first and second regions can be seen when the decorative article is viewed from a first viewing angle that is aligned with the forward/backward direction and/or the tip axis. In some cases, this effect with a visible boundary line may be preferred.

The diameter of the planar cross-section being substantially half the diameter of the middle section may mean that the diameter of the planar cross-section is half the diameter of the middle section within approximately 20%, preferably approximately 10%, more preferably approximately 5% of the diameter of the planar cross-section.

A perimeter of the middle section in a plane perpendicular to the forward/backward direction and/or the tip axis may be polygonal, circular, elliptic, pear-shaped or heart-shaped.

The diameter of a non-circular middle section may be a diameter of a circumscribed or an inscribed circle of the non-circular middle section, or an average of the two. The middle section may comprise at least one facet and/or comprise at least one edge.

The diameter of a non-circular planar cross-section of the back side may be a diameter of a circumscribed or an inscribed circle of the non-circular planar cross-section, or an average of the two.

The front side of the decorative element may comprise a table facet. A diameter of the planar cross-section may be substantially equal to a diameter of the table facet. This arrangement means that it is not possible to see the boundary between the first and second regions when the decorative article is viewed from a first viewing angle that is aligned with the forward/backward direction and/or the tip axis, which may provide a particularly desirable observed effect. When the diameter of the planar cross-section is substantially smaller than the diameter of the table facet, the boundary between the first and second regions can be seen when the decorative article is viewed from a first viewing angle that is aligned with the forward/backward direction and/or the tip axis. In some cases, this effect with a visible boundary line may be preferred.

The diameter of the planar cross-section being substantially equal to the diameter of the table facet may indicate that the diameter of the planar cross-section is equal to the diameter of the table facet within approximately 20%, preferably approximately 10%, more preferably approximately 5% of the diameter of the planar cross-section.

The table facet may be polygonal, circular, elliptic, pear-shaped or heart-shaped. The table facet may extend substantially perpendicularly to the forward/backward direction and/or the tip axis. The diameter of a table facet may be a diameter of a circumscribed or an inscribed circle of the non-circular middle section, or an average of the two.

The diameter of the table facet may be approximately half the diameter of the middle section of the element.

At least one of the first and second coatings may be an absorption colour coating system. By using an absorption colour coating system for at least one of the first and second coatings, the observed colour effect of the decorative article can be controlled more reliably.

At least one of the first and second coatings may be a thermal colour fusion coating system.

The first and second coatings may be absorption colour coating systems. The first colour effect may be darker than the second colour effect. When two different colour coatings of an absorption colour coating system are used, it is advantageous that the first colour effect is darker than the second colour effect so as to reduce the likelihood that the second colour effect detrimentally impacts the intended colour effect of the first colour effect.

At least one of the first and second coatings may be an interference colour coating system. When an interference colour coating system is used for one of the first and second coatings, complex and striking observed colour effects of the decorative article can be achieved.

The invention also extends to a method of making a decorative article with an observed colour effect that is changeable depending on observer viewing angle. The method comprises the steps of: providing a decorative element comprising a front side facing a forward direction and a back side opposite the front side facing a rearward direction, wherein the back side comprises a back surface having a first region and a second region surrounding the first region; arranging a first coating on the first region of the back surface, the first coating causing a first colour effect; arranging a second coating on the second region of the back surface, the second coating causing a second colour effect that differs from the first colour effect.

The second region surrounding the first region signifies that the second region completely encloses the first region, i.e. that the second region encloses the first region all the way around the first region. In this way, the second region is arranged adjacent to the first region on all sides of the first region. In other words, the first region is bounded by the second region—that is, the first region is surrounded (i.e. on all sides/entirely) by a periphery, the second region bordering (all parts of) the periphery.

The method may comprise arranging the first coating on the first region of the back surface before the step of arranging the second coating on the second region of the back surface.

The step of arranging the first coating on the first region may comprise: covering the second region of the back surface with a mask; arranging the first coating on the back surface; and removing the mask from the second region of the back surface of the back side, such that the second region is free from the first coating.

The step of arranging the second coating on the second region of the back surface may comprise: arranging the second coating on the entire back surface of the back side. This is advantageous as only one masking stage is necessary to produce the decorative elements.

The step of covering the second region of the back surface with a mask may comprise: providing a mask having an aperture, and arranging the back side of the decorative element in the aperture such that the second region is shielded by the mask and the first region is exposed through the aperture. The step of arranging a first coating on the back surface of the back side may comprise arranging the first coating on the decorative element on the exposed first region. The mask with an aperture provides an easy and time-efficient way of arranging the first coating on the first region of the back surface. The second coating can then easily be arranged on the entire back surface and thereby be arranged on the second region of the back surface.

A diameter of the aperture may be substantially equal to a diameter of the first region. In particular, a diameter of the aperture may be selected to be less than the diameter of a middle section of the decorative element that joins the front side and the back side. This arrangement prevents the decorative element from falling through the aperture when the mask is arranged such that it extends parallel to the ground.

The mask may be a sheet comprising an aperture. Preferably, the sheet is a metallic sheet.

The method may comprise arranging the sheet substantially horizontally, and arranging the decorative element on a top surface of the sheet, such that the first region of the decorative element is exposed by through the aperture. When the back surface of the decorative element comprises a tip, the method may optionally comprise allowing the tip to protrude downwardly into or through the aperture.

The step of removing the mask from the second region of the back surface of the back side may comprise removing the decorative element from the aperture of the mask.

The invention also extends to a method of making a plurality of decorative articles each with a changeable observed colour effect, wherein each article is made in accordance with the method described above. In this case, the mask may comprise a plurality of apertures. The method may comprise arranging a back side of each of the plurality of decorative elements in an aperture of the mask such that each second region is shielded by the mask and each first region is exposed through a respective aperture. The sheet with a plurality of aperture provides an easy and time-efficient way of applying a first coating to of a plurality of decorative elements.

Each first region may be exposed by an aperture on the same side of the mask

The mask may be a (preferably metallic) sheet comprising a plurality of apertures.

In any of the articles or methods described above, the decorative element may be at least partially transparent or translucent. The decorative element may be made of glass, ceramic, glass-ceramic, precious or semi-precious stone or a plastics material. In preferred embodiments, the decorative element is made of glass, most preferably crystal glass, cubic zirconia, sapphire, or nanogem.

Features of any one aspect or embodiment of the invention may be used, alone or in appropriate combination, with any other aspects and embodiments as may be appropriate.

BRIEF DESCRIPTION OF THE DRAWINGS

The above and other aspects of the invention will now be described, by way of example only, with reference to the remainder of the accompanying drawings, in which.

DETAILED DESCRIPTION OF THE INVENTION

Figure 1:
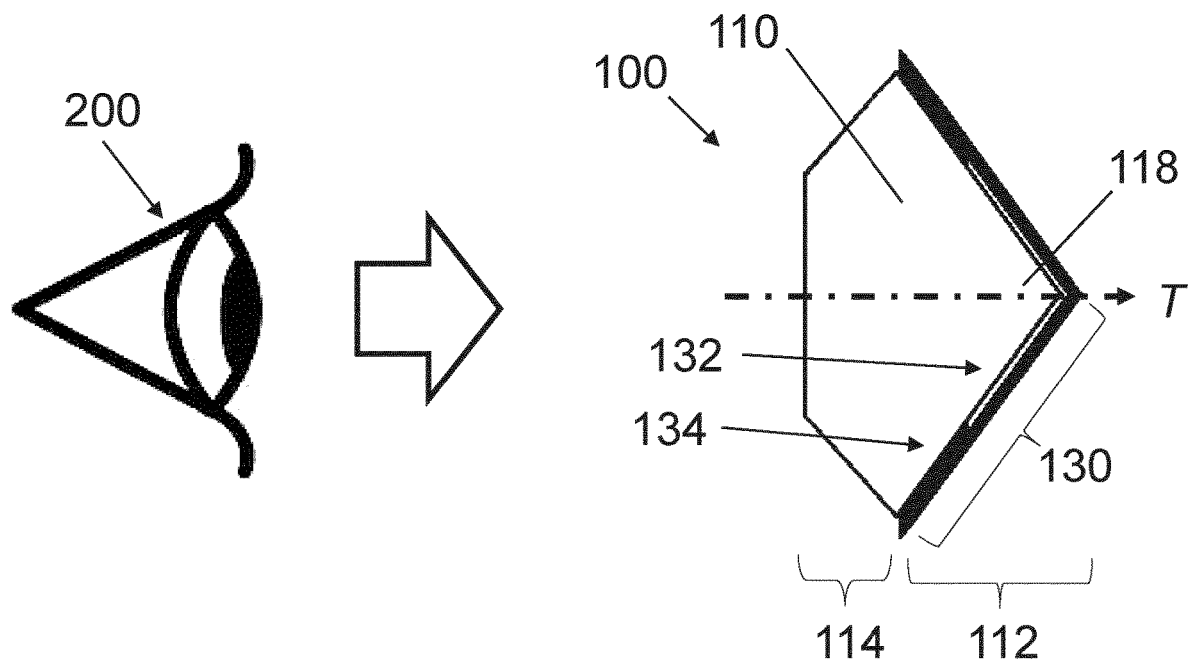
FIG. 1 is a cross-sectional view of a decorative article of the invention comprising a decorative element with a front side and a back side, said back side being coated with first and second coatings, and said decorative article being observed from a first viewing angle.
Figure 2:
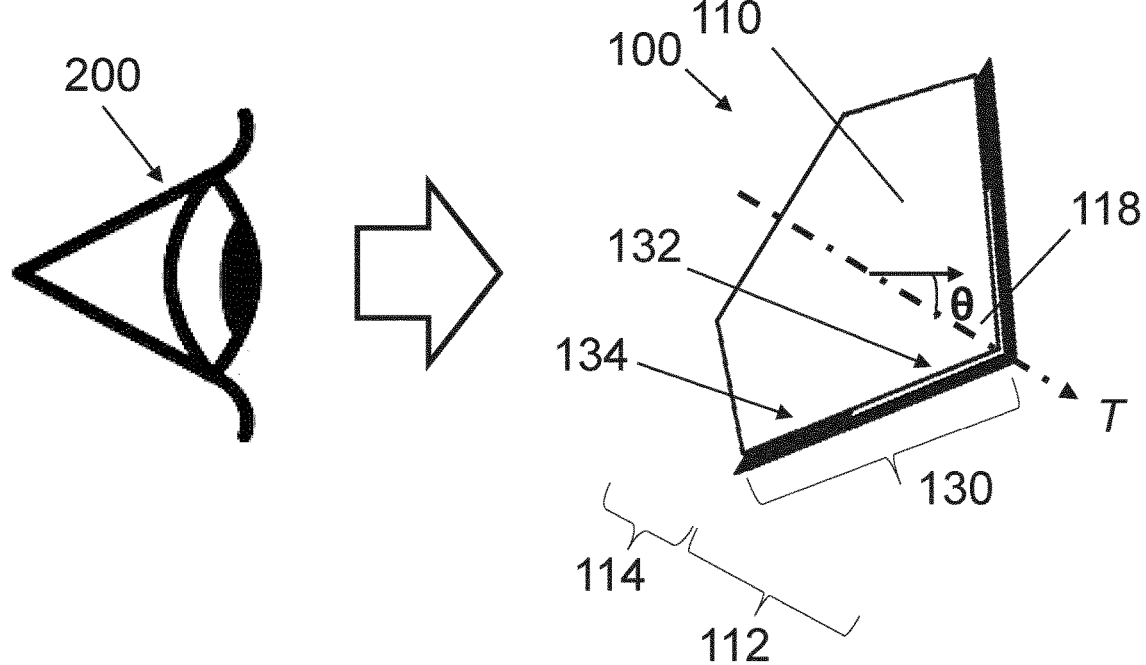
FIG. 2 is a cross-sectional view of the decorative article of FIG. 1, said decorative article being observed from a second viewing angle that differs from the first viewing angle.

FIGS. 1 and 2 illustrate a decorative article 100 comprising a decorative element 110, such as a gemstone. The decorative element 110 has a front side 114 that generally faces the observer (i.e. the decorative element 110 is generally viewed from the front), and a back side 112 on which two different coatings or layers 130 are provided. The two different coatings 130 each have a different colour effect, and are arranged on the back side 112 of the decorative element 110 in such a way that, when the decorative element 110 is viewed generally from the front, the observed appearance of the overall colour effect of the decorative article 100 changes predictably depending on an observer viewing angle, θ, as will be described in detail below.

Figure 3:
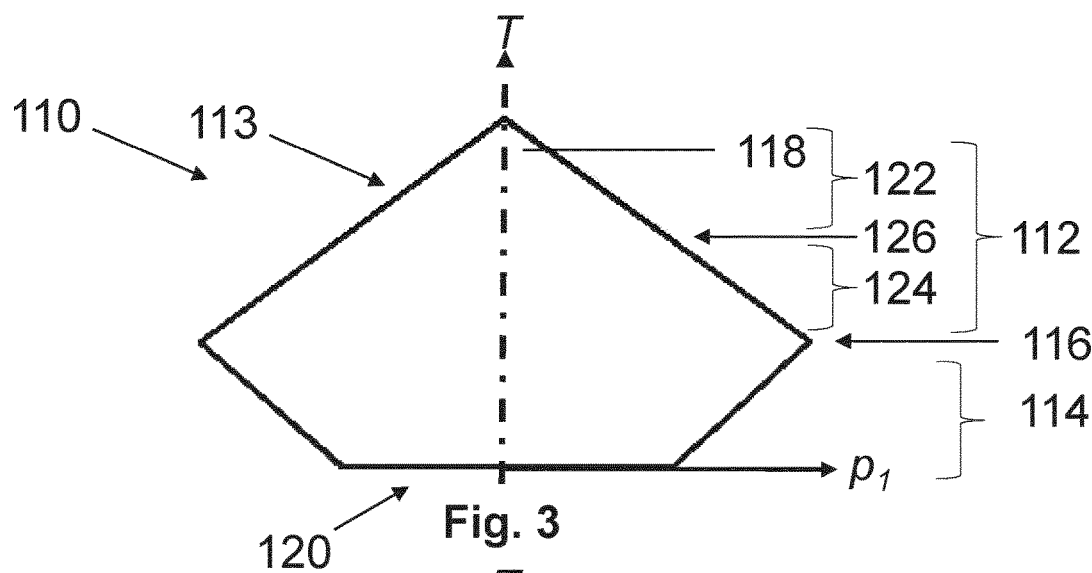
FIG. 3 is cross-sectional view of the decorative element of the decorative article of FIG. 1.

The decorative element 110 comprises a front side 114, or crown, that faces in a forward or presentation direction, a back side 112, or pavilion, that faces in a rearward direction, and a middle section 116, or girdle, between the front side 114 and the back side 112 (see FIG. 3). The back side 112 comprises a back surface 113 that defines a generally rearward-facing surface of the decorative element 110. In this example, the back side 112 tapers to a tip 118 along a tip axis, T. The tip axis, T, is generally parallel to the forward and rearward directions.

The back side 112 of the decorative element 110 comprises two regions: a first region 122 and a second region 124 that surrounds the first region. In this case, the first region is substantially central to the back side 112, and the first and second regions 122, 124 define concentric rings, though other arrangements are also envisaged.

In this example, where the back side 112 of the decorative element 110 comprises a tip 118, the first region 122 is adjacent or proximal to the tip 118, such that the first region 122 encompasses the tip 118, and the second region 124 is remote, or distal, from the tip 118.

Figure 4:
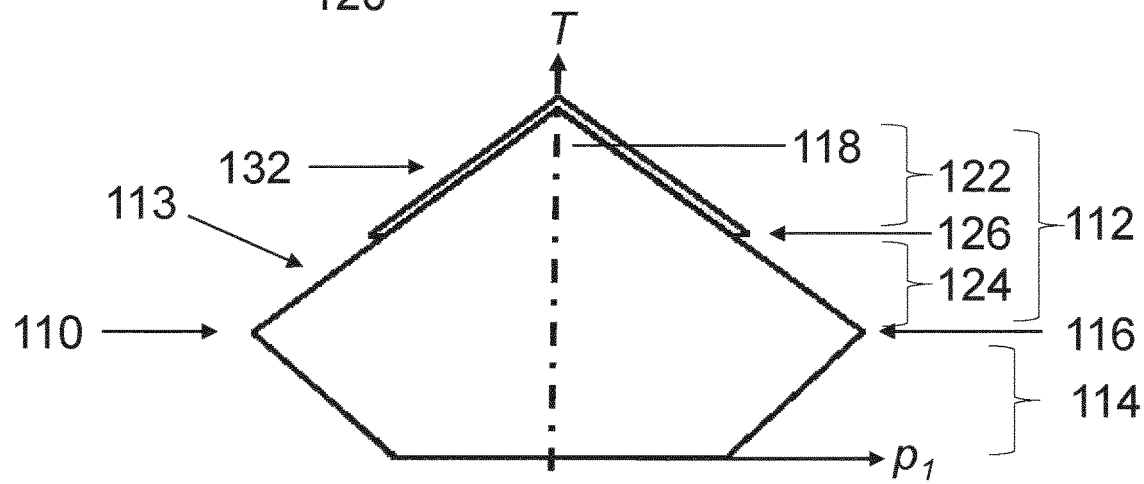
FIG. 4 is cross-sectional view of the decorative element of the decorative article of FIG. 1 with a first coating applied to the back side of the decorative element.
Figure 5:
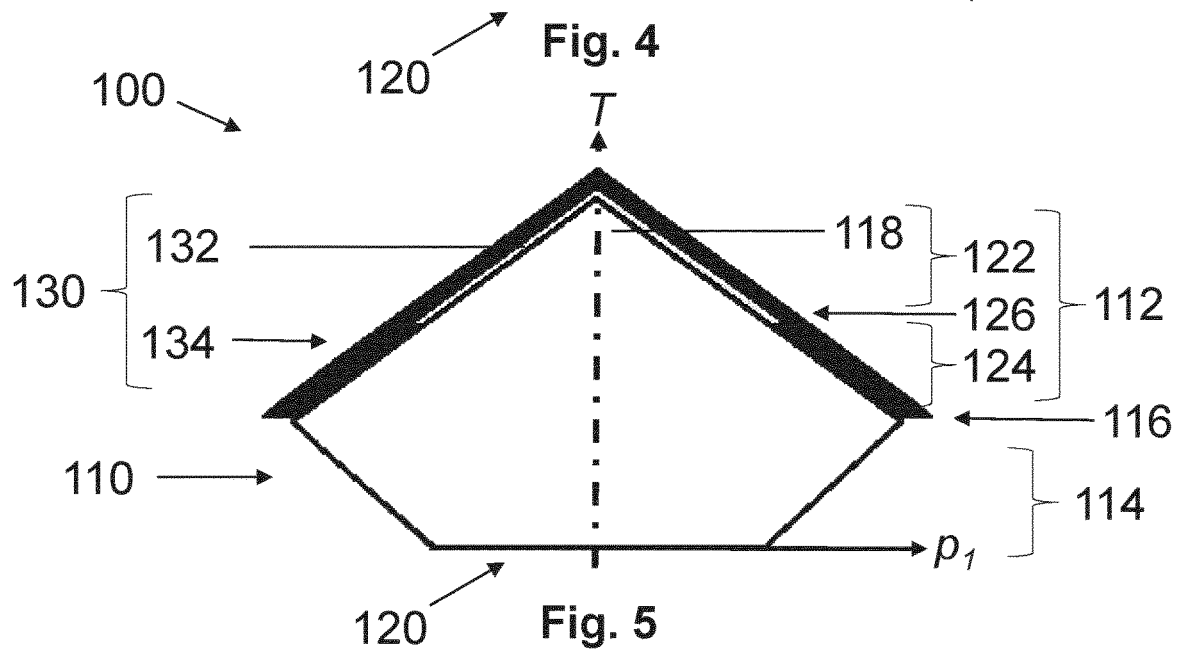
FIG. 5 is cross-sectional view of the decorative element of the decorative article of FIG. 1 with first and second coatings applied to the back side of the decorative element.

Referring to FIG. 4, a first coating 132 causing a first colour effect is provided on the first region 122, such that light can be transmitted to the first coating 132 through the decorative element 110 in the first region 122. A second coating 134 causing a second colour effect that differs from the first colour effect is provided on the second region 124, such that light can be transmitted to the second coating 134 through the decorative element 110 in the second region 124. In this example, the second coating 134 also extends over the first coating 122 in the first region 122 (as in FIG. 5), though this need not be the case.

In FIGS. 1 and 2, an observer 200 views the decorative element 110 from the front at an angle, θ, with the forward direction and hence the tip axis, T. In FIG. 1, the decorative article 100 is viewed from directly in front, from a first viewing angle that is aligned with the forward and rearward directions and hence the tip axis, T; that is, the decorative article is viewed at an angle of 0° to the tip axis, T. In FIG. 2, the decorative article is viewed from the side, from a second viewing angle that differs from the first viewing angle and that is transverse (i.e. non-parallel) to the forward and rearward directions and hence the tip axis, T. In this example, the decorative article 100 is viewed at angle, θ, of about 45° to the tip axis, T.

In both arrangements, and whenever the decorative element 110 is viewed from the front, light enters the decorative element 110 from the front side 114 and travels through the decorative element 110 to the back side 112 where the first and second coatings 132, 134 are applied. Depending on the colours of the first and second coating 132, 134, only certain wavelengths of light are then reflected back through the decorative element 110 and towards the observer 200 such that the decorative element 110 appears with a particular overall colour effect to the observer 200.

Due to the arrangement of the coatings 130 on the back surface 113, in which the first coating 132 is applied in the first region 122 and the second coating 134 is applied in the second region 124, the first and second colour effects are each observed differently when the article is viewed from the different viewing angles. In this particular case, the two different colour effects will be visible to different extents at different viewing angles.

In particular, in this example, the first colour effect is more dominant when the decorative article 100 is viewed from the first viewing angle (as in FIG. 1) than when the decorative article 100 is viewed from the second viewing angle (as in FIG. 2), while the second colour effect is less dominant when the decorative article 100 is viewed from the first viewing angle (as in FIG. 1) than when the decorative article 100 is viewed from the second viewing angle (as in FIG. 2). In other words, the degree of observability or dominance of the first colour effect increases when moving from the first viewing angle to the second, and the degree of observability or dominance of the second colour effect increases when moving from the second viewing angle to the first.

This change in observed colour effect occurs because, as the viewing angle changes, the observer's eye captures different light reflected from the decorative element 110. At the first viewing angle, the eye mostly captures light reflected from the first coating 132, and captures relatively little light reflected from the second coating 134. At the second viewing angle, the eye capture less light from the first coating 132 and more light from the second coating 134, compared to the first viewing angle.

It should be appreciated that at both viewing angles, both the first and second colour effects may be visible to some extent, but the relative proportions of the first and second colour effects that are observed varies according to the viewing angle, such that the first colour effect is visible to a greater extent at the first viewing angle than the second viewing angle, and the second colour effect is visible to a greater extent at the second viewing angle than the first viewing angle.

As such, this arrangement of coatings 130 results in an observed colour effect of the decorative article 100 that changes reliably and predictably with observer viewing angle, θ.

Figure 6:
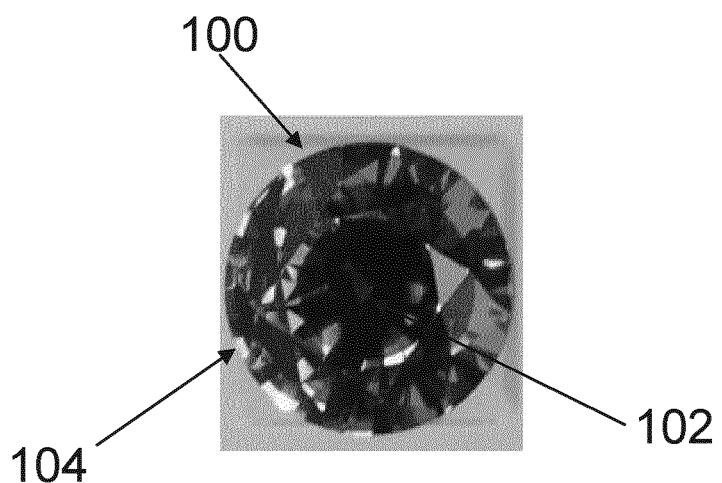
FIG. 6 is a front-view photograph the decorative article of the invention.
Figure 7:
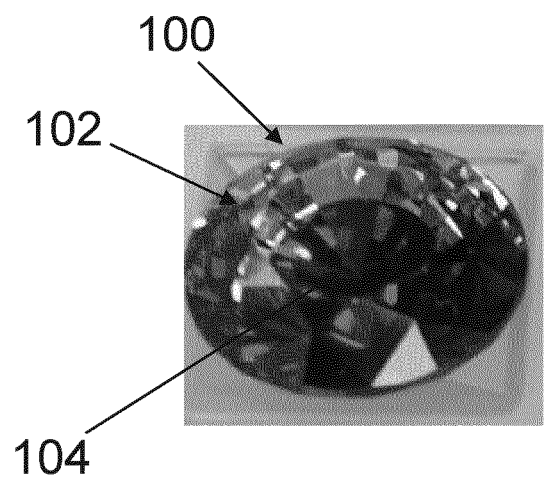
FIG. 7 is a side-view photograph of the front side of the decorative article of FIG. 6.

The change in the observed colour effect can be seen in FIGS. 6 and 7, which are photographs of an example of the decorative article 100 from different viewing angles. This decorative article 100 comprises a circular decorative element 110 in the form of gemstone that has a first coating 132 causing a first colour effect 102, specifically a dark orange/red colour, in the first region 122, and a second coating 134 causing a second colour effect 104, specifically a yellowish gold colour, in the second region 124. In this particular example, the first colour effect is therefore darker than the second colour effect.

FIG. 6 is a top-down photograph of the decorative article 100. In this photograph, the decorative article 100 is viewed from a first viewing angle that is parallel to the forward direction and hence aligned with the tip axis, T (as per the arrangement in FIG. 1). Being viewed parallel to the forward direction, the first colour effect 102 (i.e. the dark orange/red colour), dominates the observed colour effect of each of the decorative articles 100. Only near the corners of the decorative articles 100 is the second colour effect 104 (i.e. the yellowish gold colour), perceptible.

FIG. 7 is a side-view photograph of the same four decorative articles of FIG. 6. In this photograph, the four decorative articles 100 are viewed from a second viewing angle that is transverse to the forward direction and the tip axis, T. In particular, the decorative articles 100 are viewed at an angle of 45° to the tip axis, T. Here, the second colour effect 104, yellowish gold colour, is more visible than in FIG. 6. When the decorative articles 100 of FIGS. 6 and 7 are viewed at an angle of more than 45° to the tip axis, T, the yellowish gold colour, dominates the observed colour effect of each of the decorative articles 100 more, and the first colour effect 102, the dark orange/red, is less visible.

Considering first the decorative element 110 in more detail, the decorative element 110 is transparent, or translucent (i.e. semi-transparent), or is at least partially transparent or translucent i.e. the decorative element 110 allows light, or at least some light, to pass therethrough. The more transparent the decorative element 110, the more perceptible the first and second colour effects of the first and second colour coatings 132, 134. In this example, the decorative element is colourless, though for decorative reasons, it can be beneficial to use a decorative element 110 having a particular colour in combination with the first and second colour coatings 132, 134 to produce different colour effects.

As stated above, the decorative element may be a gemstone. When the decorative element 110 is a gemstone, the front side 114 corresponds to a crown of the gemstone, the back side 112 to a pavilion of the gemstone, the middle section 116 to a girdle of gemstone, and the tip 118 to a culet of the gemstone. Such a gemstone may be made of any suitable material, for example glass, ceramic, glass-ceramic, a precious or semi-precious stone, or a plastics material. Particular examples include cubic zirconia, sapphire, nanogem and crystal glass.

The decorative element may be chaton-shaped (or round-shaped), or a fancy stone such as a square-shape, heart-shape, pear-shape, oval-shape, or any other suitable shape. In the example shown, the decorative element comprises a tip 118 to which the back side 112 tapers. However, embodiments are also envisaged in which the back side 112 is flat. In such embodiments, the front side 114 may instead taper to a tip along a tip axis T, and the tip axis T may pass through the first region 122 of the coating on the back side 112 of the decorative element.

Figure 8A:
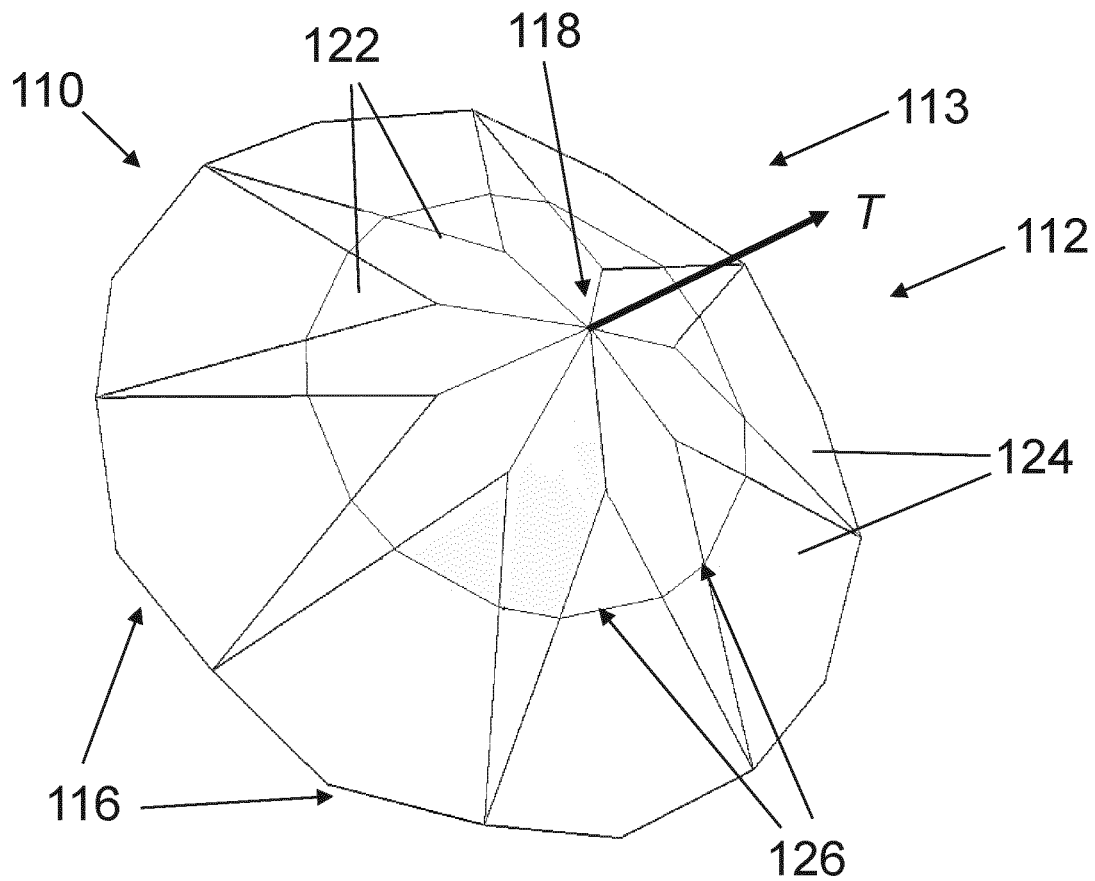
FIG. 8a is a perspective view of the back side of the decorative element of FIG. 3.

As best seen in FIG. 8a, since the back side 112 of the decorative element 110 tapers towards the tip 118, the back side 112 is generally substantially conical. In some embodiments, the conical back side 112 is substantially circular, while in others, the conical back side 112 is substantially polygonal (i.e. the back side 112 is substantially pyramidal). The specific shape of the conical back side 112 depends on the cut of the decorative element 110.

Figure 8B:
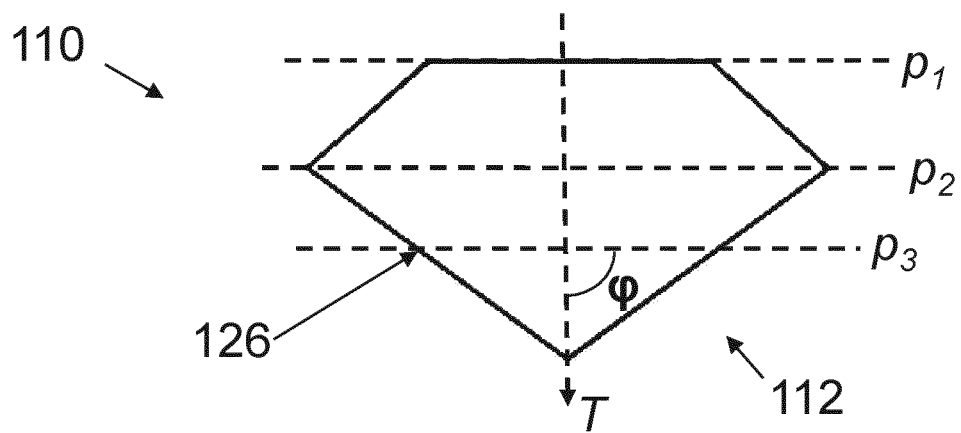
FIG. 8b is a cross-sectional view from the side of the decorative element of FIG. 3.

As shown in FIGS. 3, 4, 5 and 10, the front side 114 of the decorative element 110 comprises a table facet 120, that extends in the plane, $p_1$, that is substantially perpendicular to the tip axis, T. The location of the plane $p_1$ is best seen in FIG. 8b.

Figure 10:
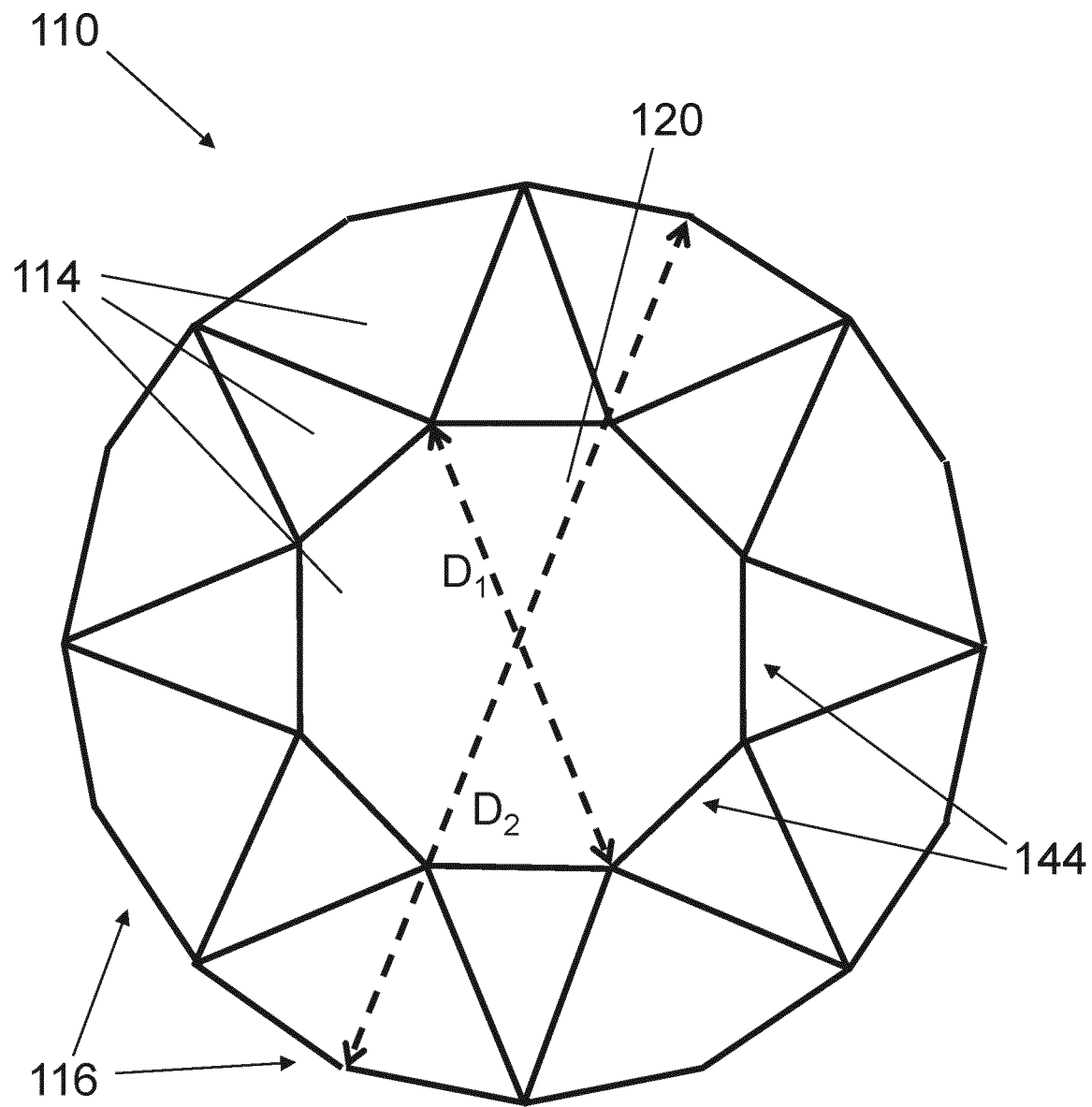
FIG. 10 is a front-view of the decorative element of FIG. 3.

As shown in FIG. 10, the table facet 120 takes the shape of a regular polygon: in this case an octagon. However, in other embodiments, the table facet 120 could be another suitable shape, for example circular, elliptical, pear-shaped, heart-shaped or shaped any other shape depending on the cut of the decorative element 110. The skilled person appreciates that the table facet 120 could be flat or curved.

The table facet 120 has a diameter $D_1$. It will be appreciated that the table facet is non-circular so a suitable method must be defined for determining the diameter. The diameter $D_1$ of the non-circular table facet 120 can be determined by measuring a diameter of a circumscribed or an inscribed circle of the polygonal shape of the table facet 120, or by taking an average of the two.

As shown in FIGS. 3, 4, 5 and 8a, the decorative element 110 comprises a middle section 116 or girdle that joins the front side 114 and the back side 112 of the decorative element 110.

Figure 9:
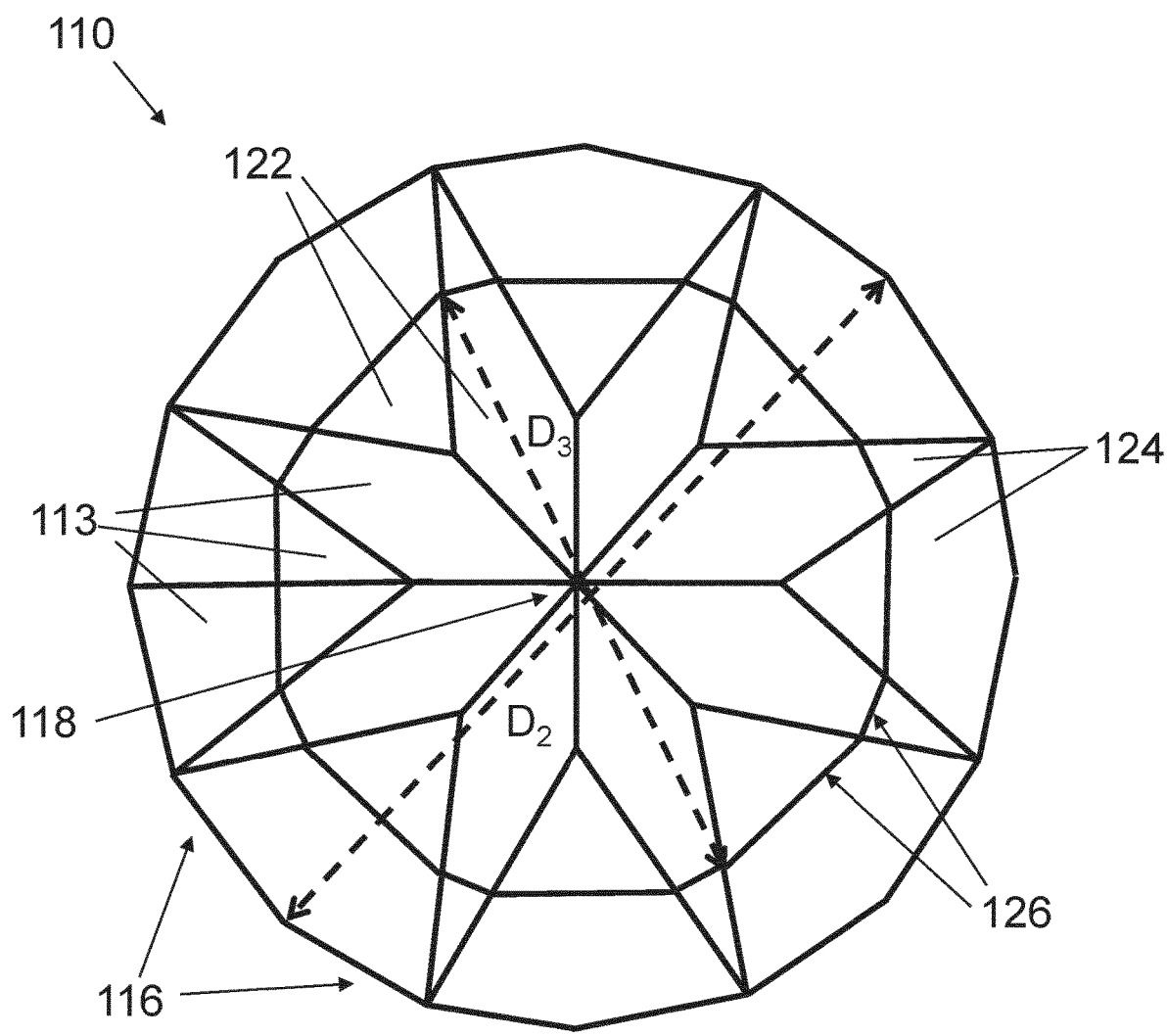
FIG. 9 is a back view of the decorative element of FIG. 3.

As best seen in FIGS. 8b, 9 and 10, in a plane $p_2$ that is perpendicular to the tip axis T (i.e. in a girdle plane $p_2$), the middle section 116 has a perimeter that is shaped as a regular polygon: in this case a 16-sided polygon. In other embodiments, the perimeter may be another shape, such as another regular or irregular polygonal, circular, elliptical, pear-shaped, heart-shaped or any other shape depending on the cut of the decorative element 110. The middle section 116 has a diameter $D_2$. Similarly to the diameter $D_1$ of the table facet 120, the diameter $D_2$ of the middle section 116 can be determined by measuring a diameter of a circumscribed or an inscribed circle of the non-circular middle section 116, or by taking an average of the two.

The coatings 130 that are applied to the decorative element 110 will now be described in more detail.

As stated above, the first coating 132, causing a first colour effect, is provided on the back surface 113 of the decorative element 110 in the first region 122, and the second coating 134, causing a second colour effect that differs from the first colour effect, is provided on the back surface 113 of the decorative element 110 in the second region 124.

Referring to FIGS. 8b and 9, the first and second regions 122, 124 are separated by a boundary 126. The boundary 126 defines a boundary line that divides the back surface 113 of the back side 112 into the first region 122 having the shape of a conical shell, and a second region having the shape of a frusto-conical shell.

In FIGS. 8a and 9, the boundary 126 is defined more specifically by a perimeter of a planar cross-section of the back side 112. In this example, referring to FIG. 8b, the planar cross-section is defined as the cross section in a plane, $p_3$, that is substantially perpendicular to the tip axis, T. It will be appreciated that, in practice, the cross-sectional plane that defines the boundary line may not be precisely perpendicular to the tip axis, T. For example, an angle, φ, between the plane $p_3$ and the tip axis T may be between 80° and 100°, or preferably between 85° and 95°.

As best shown in FIG. 9, the boundary line defines the shape of a polygon, which in this case is a 16-sided polygon. This polygon has a diameter $D_3$ that can be determined by calculating a diameter of a circumscribed or an inscribed circle, or an average of the two, consistent with the measurements of the diameters $D_1$ and $D_2$ described above.

In the embodiment described, the diameter $D_3$ of the boundary line is substantially equal to half the diameter $D_2$ of the middle section 116. For example, the diameter $D_3$ of the planar cross-section of the back side 112 may be equal to half the diameter $D_2$ of the middle section 116 within a tolerance of approximately 20%, preferably approximately 10%, more preferably approximately 5%.

Alternatively or additionally, the boundary line may have a diameter $D_3$ that is substantially equal to the diameter $D_1$ of the table facet 120. For example, the diameter $D_3$ of the planar cross-section of the back side 112 may be equal to the diameter $D_1$ of the table facet 120 within a tolerance of approximately 20%, preferably approximately 10%, more preferably approximately 5%.

When the diameter $D_3$ of the boundary line is at least substantially equal to the diameter of the table facet 120, and the decorative article 100 is viewed from directly in front as in FIG. 10, the boundary line does not lie under the table facet 120, but instead lies under the crown facets. In this way, light reflected from the boundary line is reflected by the crown facets, and the effect is that the boundary line is distorted and 'blurred' to the observer, such that the viewer does not see a distinct boundary 126 between the first and second regions 122, 124 when the decorative article 100 is viewed from directly in front.

If the boundary line has a diameter $D_3$ that is less than the diameter $D_1$ of the table facet 120, the boundary line lies directly beneath the table facet 120, and thus is not distorted by the crown facets. In this case, the boundary 126 can be seen when the decorative article 100 is viewed from directly in front.

Figure 11:
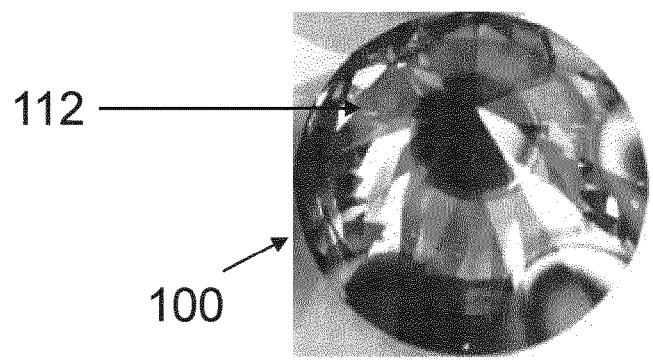
FIG. 11 is a side-view photograph of a back side of another decorative article of the invention and a schematic cross-sectional view of said article, indicating a position of a plane that defines a boundary between first and second regions of said article.
Figure 11:
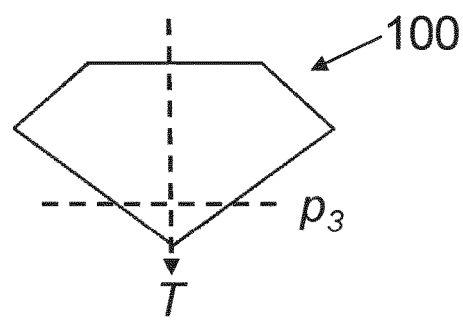
Figure 12:
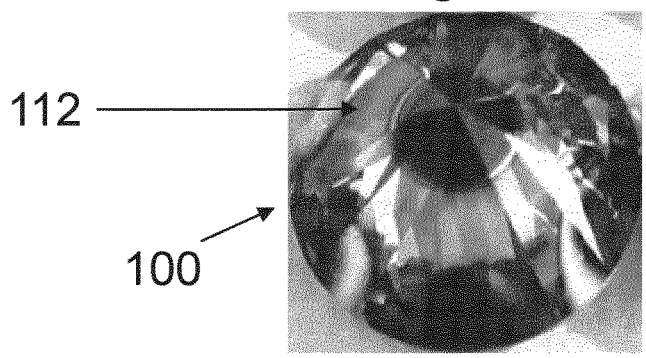
FIG. 12 is a side-view photograph of a back side of another decorative article of the invention and a schematic cross-sectional view of said article, indicating a position of a plane that defines a boundary between first and second regions of said article.
Figure 12:
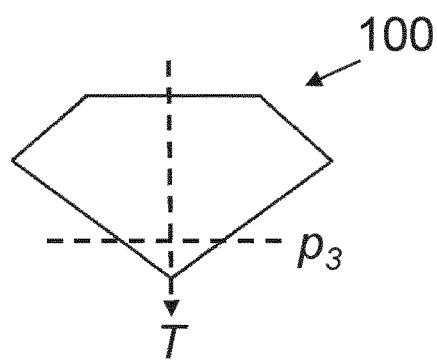
Figure 13:
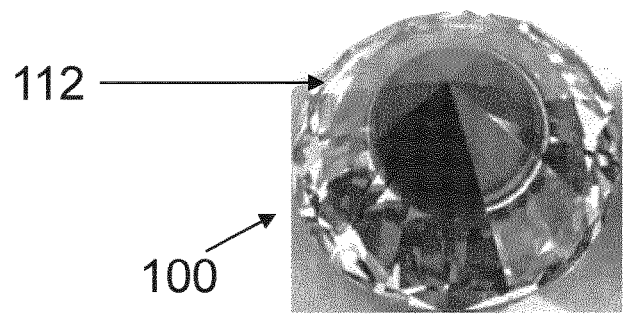
FIG. 13 is a side-view photograph of a back side of another decorative article of the invention and a schematic cross-sectional view of said article, indicating a position of a plane that defines a boundary between first and second regions of said article.
Figure 13:
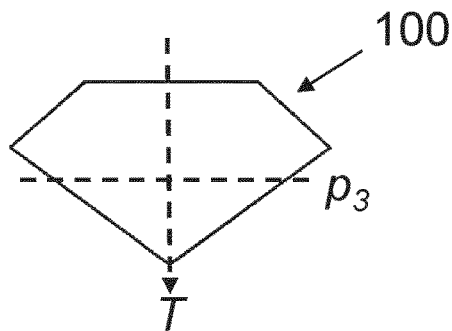
Figure 14:
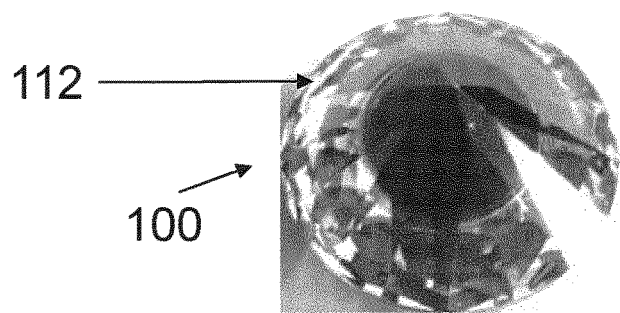
FIG. 14 is a side-view photograph of a back side of another decorative article of the invention and a schematic cross-sectional view of said article, indicating a position of a plane that defines a boundary between first and second regions of said article.
Figure 14:
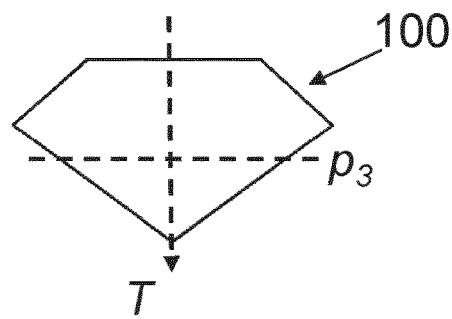

FIGS. 11 to 14 are photographs of four decorative articles 100, where the boundary 126 is defined by different planar cross-sections of the back side 112, said cross-sections having different diameters. In FIGS. 11 and 12 the boundary line has a diameter $D_3$ that is less than the diameter $D_1$ of the table facet 120, whereas in FIGS. 13 and 14, the boundary line has a diameter $D_3$ that is at least as large as the diameter $D_1$ of the table facet 120.

By modifying the shape and the location of the boundary 126, the observed colour effect of the decorative article 100 can therefore be modified. This will also be shown in more detail the examples.

To further adjust the observed colour effect of the decorative articles 100, different types of first and second colour coatings 132, 134 can be used.

For example, at least one of the first and second coatings can be an absorption colour coating system. Examples of suitable absorption coating systems are gold (Au), iron (Fe), chromium (Cr), titanium (Ti), cobalt (Co), zirconium (Zr), tin (Sn), copper (Cu), silver (Ag), aluminium (Al) and/or silicon (Si). A layer of metal may be applied to the back side of the decorative element using a suitable method, for example a physical vapour deposition (PVD) method such as sputtering. The layer may then be subjected to a heat treatment of at least 450° C. for an appropriate period of time. After this treatment, the coatings are heat-resistant to high temperatures and, if applied to a similarly high heat-resistant decorative element such as a cubic zirconia gemstone, can be used, for example, as part of a cast-in-place jewellery making method.

When both the first and second coatings 132, 134 are absorption colour coating systems, it is advantageous if the first colour effect is darker than the second colour effect. Such an arrangement reduces the likelihood that the second colour effect will detrimentally impact the intended colour effect of the first colour effect.

In one embodiment, at least one of the first and second coatings 132, 134 is a thermal colour fusion coating system in accordance with European Patent No. 1479308.

In another embodiment, one or both of the first and second coatings 132, 134 is an interference colour coating system. Such interference systems typically comprise oxides, nitrides, oxynitrides and/or metals, and layers of appropriate materials can be applied using any suitable method, such as a suitable physical vapour deposition (PVD) method.

Figure 15:
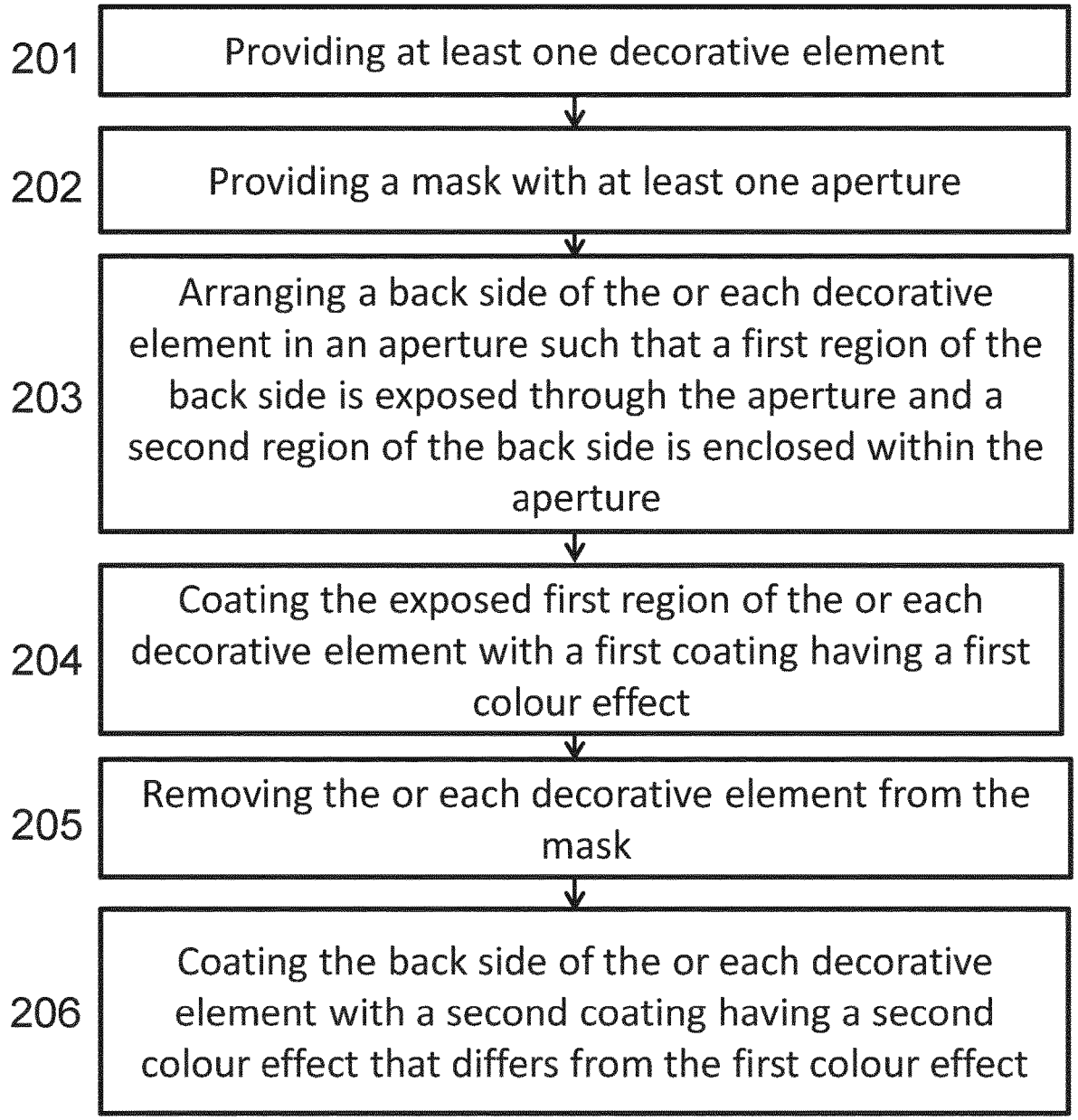
FIG. 15 is a flow chart indicating the steps of a method in accordance with the invention.

A method of making at least one decorative article 100 of the invention is now detailed with reference to FIG. 15.

Figure 16:
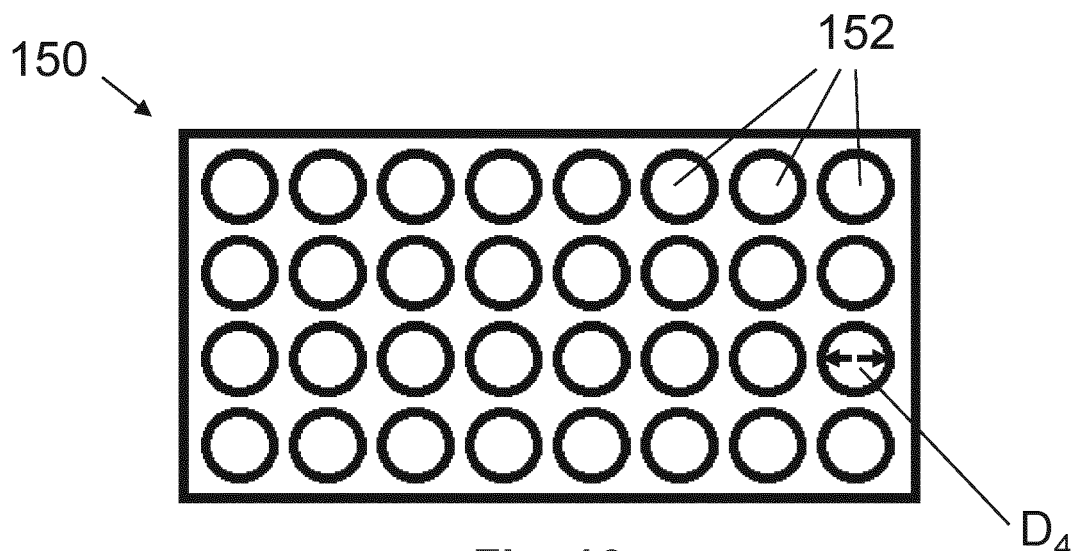
FIG. 16 is a top-down schematic of a mask for use in a method in accordance with the invention.

In the first step 201, at least one decorative element 110 is provided. In the second step 202, a mask 150 in the form of a sheet or plate comprising at least one aperture 152 is provided. Such a sheet is shown in FIG. 16, and it typically a metal sheet. The sheet may be provided with a plurality of apertures 152, each aperture 152 being substantially circular in shape.

Figure 17:
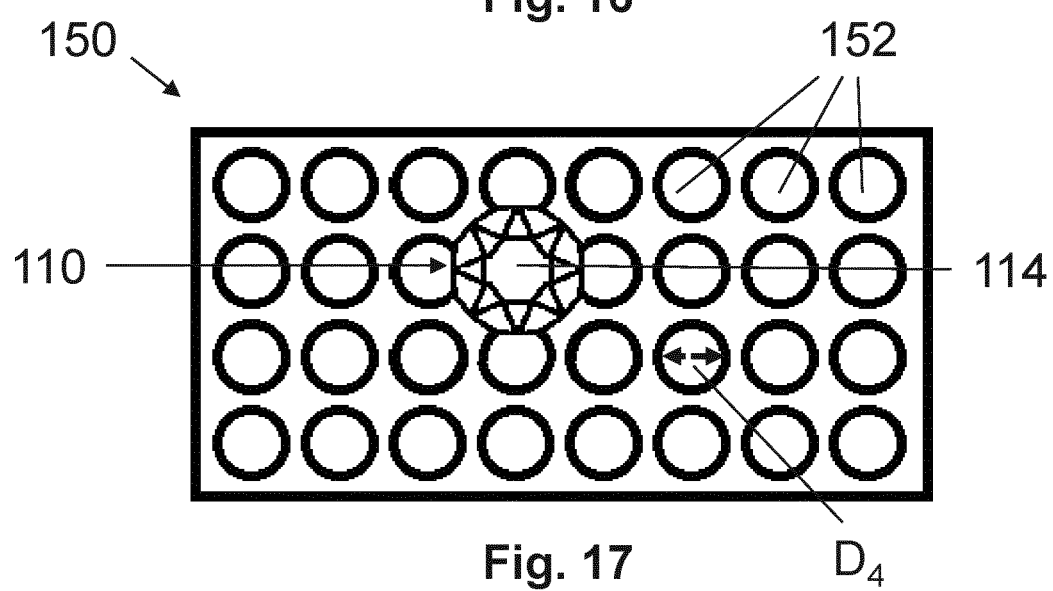
FIG. 17 is a top-down schematic of the mask of FIG. 16, wherein a back side of a decorative element has been arranged in an aperture of the mask.

In the third step 203, the back side 112 of each decorative element 110 is arranged in an aperture 152 of the mask 150, as shown in FIG. 17. To this end, the mask 150 can be arranged so that it extends in a plane that is substantially horizontal. Starting from above the mask, the tip 118 of the or each decorative element 110 is then conveyed through an aperture 152 of the mask 150 until the or each tip 118 is exposed through the aperture 152 on an underside of the mask 150, and extends towards the ground, with the tip axis, T, generally vertical.

In this arrangement, each aperture 152 of the mask 150 is smaller than the middle section 116 of each decorative element 110, so that, when the or each of the decorative elements 110 is arranged in an aperture 152, each decorative element is 'caught' and securely arranged in an aperture 152.

Preferably, the diameter $D_4$ of each aperture 152 is between 10 and 90% of the diameter 140 of the middle section 116 of the decorative elements 110 to be coated using the mask 150.

The diameter $D_4$ of the aperture 152 is matched to the desired diameter $D_3$ of the boundary 126 between the first and second regions 122, 124 of the back side 112. In this way, when a decorative element 110 is arranged in an aperture 152 the second region 124 of each decorative element 110, to which the second coating 134 is to be applied, is shielded by the mask 150, while the first region 122, to which the first coating 132 is to be applied, is exposed through the aperture 152.

Figure 18:
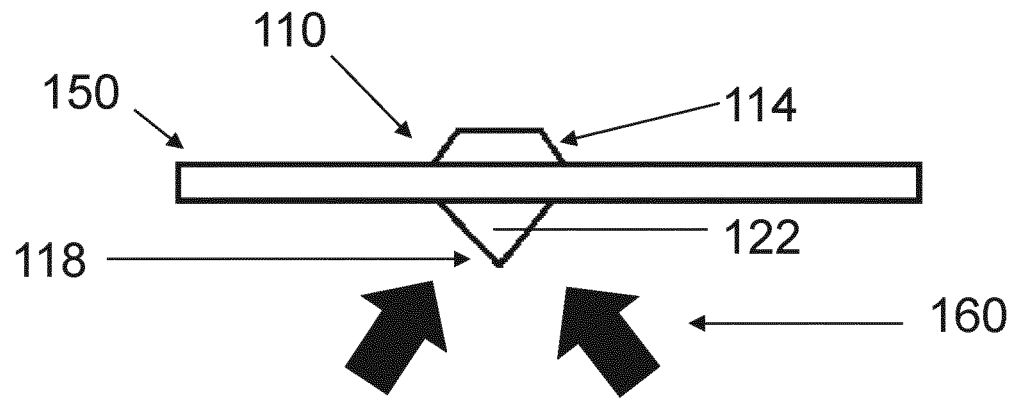
FIG. 18 is a side view schematic of the mask of FIG. 17, in which the decorative element is coated with a first coating.

In the fourth step 204, the exposed first region 122 of the decorative element 110 is coated with a first coating 132, with a first colour effect, from underneath the mask 150 (cf. FIG. 18). To this end, the exposed first region 122 can be coated using a Physical Vapour Deposition (PVD) technique, for example using a vacuum coating machine such as a Balzers BAK1050. Because the second region 124 of each decorative element is shielded by the mask 150, the second region 124 is not coated with the first coating 132 during this step.

In the fifth step 205, the decorative elements 110 with the first coating 132 applied, are removed from the apertures 152 in the mask 150.

In the sixth and final step, the second region 124 is coated with a second coating 134 with a second colour effect that differs from the first colour effect. To this end, the PVD coating machine, e.g. Balzers BAK1050, can again be used to coat the second region 124 using PVD. To simplify this step, the entire back side 112 of the decorative element 110 can be coated with the second coating 134. For example, each decorative element 110 may be placed tip-side down on a dome of the coating machine, so that the back side 112 is exposed, and the back side 112 of the decorative element 110 may be coated from directly below. In other embodiments, the first region 122 can be covered during this stage with a mask such as masking tape.

This method provides an easy and time-efficient way of applying first and second coatings 132, 134 to decorative elements 110 in accordance with the invention. Particularly when coating multiple decorative elements simultaneously, the multiple apertures 152 of the sheet-like mask avoids having to mask the second region 124 each of the decorative elements 110 individually, thereby saving time and effort.

Of course, the skilled person appreciates that other masks 150 can be used in steps 202 to 205 in place of the sheet-like mask described above. For example, a mask 150 in the form of a masking tape could be used to cover the first or second regions 122, 124 of each decorative element 110 while the corresponding first or second coating 132, 134 is applied to the decorative element 110.

EXAMPLES

Decorative articles were produced using first and second coatings in first and second region of the back surface.

Example 1

An 8.0 mm round-shaped cubic zirconia gemstone was applied with the following coatings:

|  | Coating material | Coating colour |
| --- | --- | --- |
| First coating | A layer of Fe | Red |
| Second coating | A layer of Fe | Light yellow/orange |

The first and second coatings were each applied to the back surface using the Balzers BAK1050. The first layer had a thickness of 300 nm, the second layer had a thickness of 5.5 nm. Both layers were deposited at a rate of 0.1 nm/s, with a deposition temperature of 120° C. in an oxygen atmosphere.

A total of eight samples were produced, having different diameters ($D_3$) of the boundary line between the first and second regions. The relevant diameters for each sample are shown below:

| Sample | A | B | C | D | E | F | G | H |
| --- | --- | --- | --- | --- | --- | --- | --- | --- |
| $D_3$ (mm) | 3.9 | 3.9 | 3.5 | 3.5 | 3.1 | 3.1 | 2.8 | 2.8 |

Figure 19:
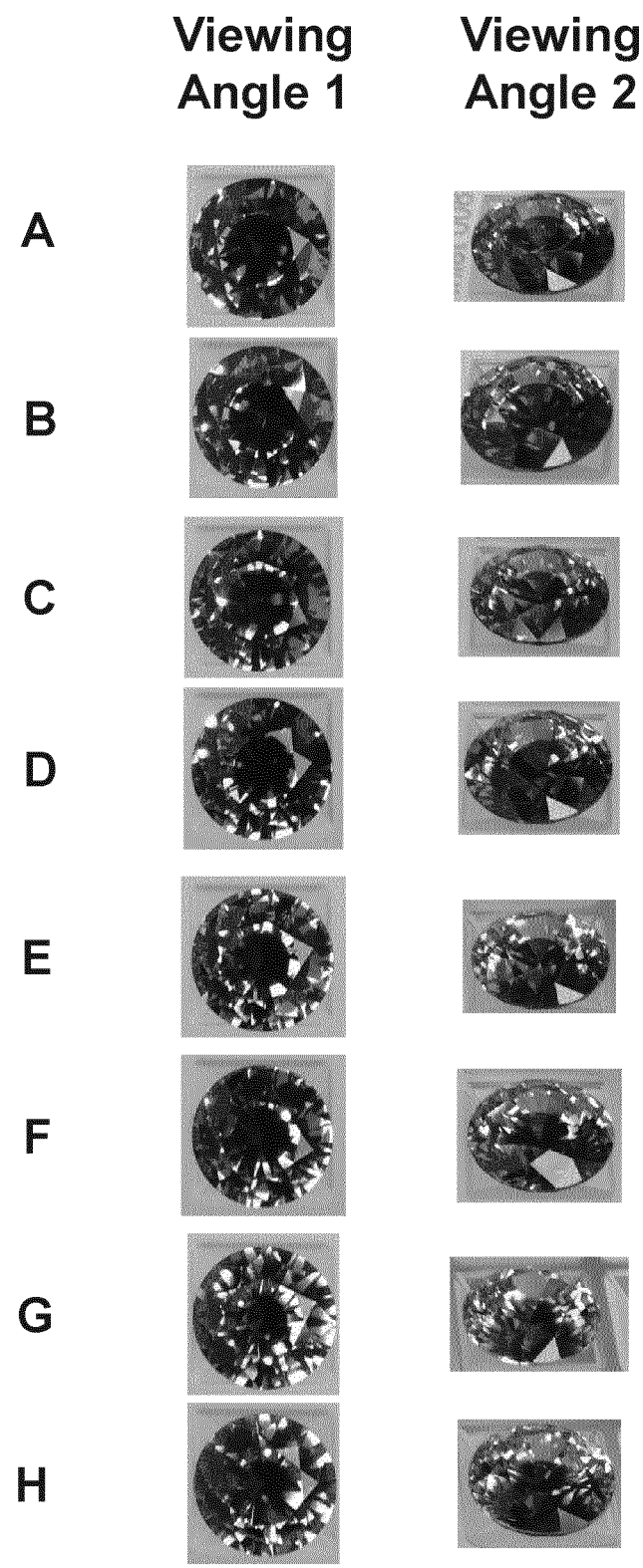
FIG. 19 is a photographic series of different samples of decorative articles at different viewing angles.

FIG. 19 shows photographs of the Samples A to H from different viewing angles. Viewing Angle 1 is as shown in FIG. 1 (parallel to the tip axis, T) and Viewing Angle 2 is as shown in FIG. 2 (transverse to the tip axis T, and in this case around 45 degrees to the tip axis, T).

In Samples A and B, the diameter of the boundary line is substantially half the diameter of the middle section (i.e. girdle) of the decorative element, and these samples the boundary between the two layers is the least visible. The diameters of the boundary line of Samples C and D are less than half the diameter of the middle section of the decorative element, and here, the boundary between the two layers are more visible than in Samples A and B. The diameter of the boundary lines of Samples E, F, G and H are even smaller than the diameter of the diameters of the boundary line of Samples C and D. The boundaries between the two layers are very distinct in Samples E, F, G and H, particularly in samples G and H, where the diameters of the boundary lines are the smallest. As the diameter of the boundary line decreases, the boundary between the two layers becomes more visually distinct and the light/yellow orange colour effect is more dominant.

As can be seen by comparing each of the Samples A, B, C, D, E, F, G and H when seen from the two different viewing angles, the red colour effect of the first coating is more dominant when each sample is seen from the Viewing Angle 1 and less dominant when each sample is seen from Viewing Angle 2. Likewise, the light yellow/orange of the second coating is more dominant when each decorative article is seen from the Viewing Angle 2, and less dominant when each decorative article is seen from Viewing Angle 1. The red colour effect of the first coating also dominates the observed colour effect of each sample when seen from Viewing Angle 1.

Example 2

In Example 2, a set of samples was prepared in which the colour effect of the first coating is lighter than the colour effect of the second coating (in contrast to Example 1 in which the colour effect of the first coating is darker than the colour effect of the second coating).

An 8.0 mm round-shaped cubic zirconia gemstone was applied with the following coatings:

|  | Coating material | Coating colour |
| --- | --- | --- |
| First coating | A layer of Au | Yellowish gold |
| Second coating | A layer of Fe | Dark orange/red |

The first and second coatings were each applied to the back surface using the Balzers BAK1050. The first layer had a thickness of 70 nm, and was deposited at a rate of 0.2 nm/s. The second layer had a thickness of 200 nm, and was deposited at a rate of 0.1 nm/s, with a deposition temperature of 120° C.

A total of eight samples were produced, having different diameters ($D_3$) of the boundary line between the first and second regions. The relevant diameters for each sample are shown below:

| Sample | I | J | K | L | M | N | O | P |
| --- | --- | --- | --- | --- | --- | --- | --- | --- |
| $D_3$ (mm) | 3.9 | 3.9 | 3.5 | 3.5 | 3.1 | 3.1 | 2.8 | 2.8 |

Figure 20:
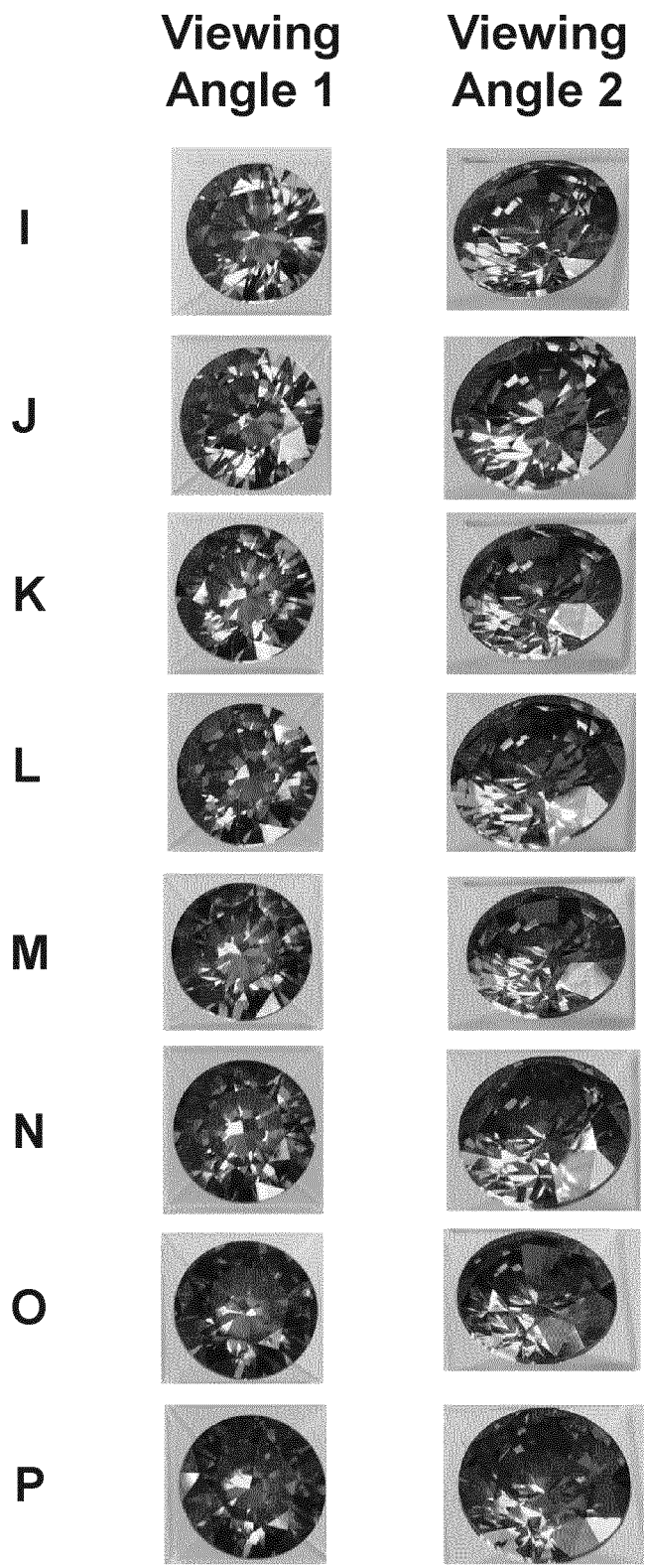
FIG. 20 is another photographic series of different samples of decorative articles at different viewing angles.

FIG. 20 shows photograph of the Samples I to P from different viewing angles. Viewing Angle 1 is as shown in FIG. 1 (parallel to the tip axis, T) and Viewing Angle 2 is as shown in FIG. 2 (transverse to the tip axis, and in this case around 45 degrees to the tip axis, T).

Like FIG. 19, FIG. 20 also shows that as the diameter of the boundary line decreases from substantially half the diameter of the middle section of the decorative element, the boundary between the two layers becomes more and more visually distinct.

In this Example, as in Example 1, comparing samples from the different viewing angles, the yellowish gold colour effect of the first coating is generally more dominant when each sample is seen from the Viewing Angle 1 and less dominant when each sample is seen from Viewing Angle 2. Likewise, the dark orange/red colour effect of the second coating is more dominant when each decorative article is seen from the Viewing Angle 2, and less dominant when each decorative article is seen from Viewing Angle 1. However, in this example, the darker colour effect has a tendency to dominate over the lighter colour effect. As a result, compared to Example 1, the second colour effect is generally more visible even when viewed from the first viewing angle.

Example 3

A 6.0 mm round-shaped cubic zirconia gemstone was applied with the following coatings:

|  | Coating material | Coating colour |
| --- | --- | --- |
| First coating | A layer of Cr | Black |
| Second coating | A layer of Au | Gold |

The first and second coatings were each applied to the back surface using the Balzers BAK1050. The first layer had a thickness of 50 nm, the second layer had a thickness of 50 nm. Both layers were deposited at a rate of 0.1 nm/s.

A total of six samples were produced, having different diameters ($D_3$) of the boundary line between the first and second regions. The relevant diameters for each sample are shown below:

| Sample | Q | R | S | T | U | V |
| --- | --- | --- | --- | --- | --- | --- |
| $D_3$ (mm) | 3.9 | 3.9 | 3.5 | 3.5 | 3.1 | 3.1 |

Figure 21:
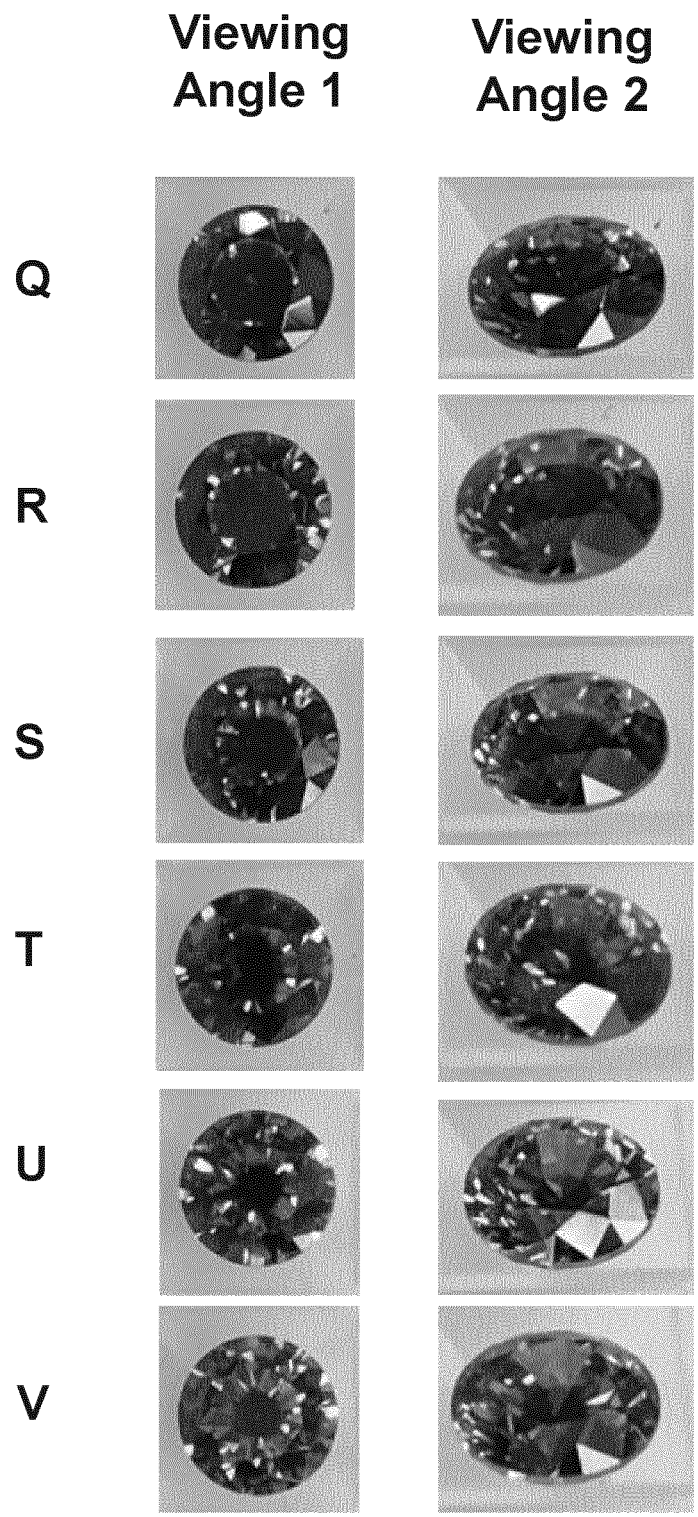
FIG. 21 is another photographic series of different samples of decorative articles at different viewing angles.

FIG. 21 shows photograph of the Samples Q to V from different viewing angles. Viewing Angle 1 is as shown in FIG. 1 (parallel to the tip axis, T) and Viewing Angle 2 is as shown in FIG. 2 (transverse to the tip axis, and in this case around 45 degrees to the tip axis, T).

Like FIGS. 19 and 20, FIG. 21 also shows that as the diameter of the boundary line decreases from substantially half the diameter of the middle section of the decorative element, the boundary between the two layers becomes more and more visually distinct.

Comparing samples from the different viewing angles, it is again apparent the black colour effect of the first coating is more dominant when each sample is seen from the Viewing Angle 1 and less dominant when each sample is seen from Viewing Angle 2. Likewise, the yellow colour effect of the second coating is more dominant when each decorative article is seen from the Viewing Angle 2, and less dominant when each decorative article is seen from Viewing Angle 1. The black colour effect of the first coating also dominates the observed colour effect of each sample when seen from Viewing Angle 1.

Many variations of the invention are possible without departing from the spirit and scope of the invention as set out in the claims.

For example, a decorative article 100 of the invention can comprise more than two coatings 130 arranged so that the colour effect of each coating 130 dominates the observed colour effect of the decorative article 100 when the decorative article 100 is viewed from different observer viewing angles, θ.

The colour change effect is particularly pronounced when the first and second regions 122, 124 cover the entire back surface 113 of the decorative element 110 between them. However, the first and second regions 122, 124 need not necessarily cover the entire back surface 113 to bring about the changeable observed colour effect. For example, a portion of the back surface 113 may be uncoated.

The first and second regions 122, 124 need not take the shapes described above but may take any suitable shape as long as the second region 124 surrounds the first region 122. The shape may follow the cut of the decorative element 110, but this need not necessarily be the case. The first region 122 need not be central with respect to the back side 112 of the decorative element 110, but may be off-centre. Similarly, the boundary 126 between the first and second regions 122, 124 may be any shape, and need not be defined by a planar cross-section of the back side 112.

The invention claimed is:

1. A decorative article having an observed colour effect that is changeable depending on observer viewing angle, the article comprising:
   an at least partially transparent or translucent decorative element comprising a front side facing a forward direction and a back side opposite the front side facing a rearward direction;
   wherein the front side comprises a table facet;
   wherein the back side comprises a back surface having a first region that defines a boundary extending around the back surface and a second region that is adjacent to and borders an entirety of the boundary of the first region;
   wherein the back side tapers towards a tip along the rearward direction, and the first region is adjacent to the tip, and the second region is remote from the tip;
   wherein the boundary is defined by a perimeter of a planar cross-section of the back side; and
   wherein a diameter of the planar cross-section is substantially equal to a diameter of the table facet;
   a first coating arranged over all of the first region of the back surface, the first coating causing a first colour effect; and
   a second coating arranged over all of the second region of the back surface, the second coating causing a second colour effect that differs from the first colour effect.

2. The decorative article of claim 1, wherein the back side tapers towards the tip along a tip axis, and the tip axis passes through the first region of the back side, such that the first region is aligned with the tip.

3. The decorative article of claim 1, wherein the second coating is provided over the first coating in the first region of the back surface.

4. The decorative article of claim 1, wherein the first and second regions together cover the entire back surface of the decorative element.

5. The decorative article of claim 1, wherein the decorative element comprises a middle section that joins the front side and the back side, the diameter of the planar cross-section being substantially half a diameter of the middle section.

6. The decorative article of claim 1, wherein at least one of the first and second coatings is an absorption colour coating.

7. The decorative article of claim 1, wherein the first and second coatings are absorption colour coatings, the first colour effect being darker than the second colour effect.

8. The decorative article of claim 1, wherein at least one of the first and second coatings is an interference colour coating system.

9. A method of making a decorative article with an observed colour effect that is changeable depending on observer viewing angle; the method comprising steps of:
    providing an at least partially transparent or translucent decorative element comprising a front side facing a forward direction and a back side opposite the front side facing a rearward direction, wherein the front side comprises a table facet, wherein the back side comprises a back surface having a first region that defines a boundary extending around the back surface and a second region that is adjacent to and borders an entirety of the boundary of the first region, and wherein the back side tapers towards a tip along the rearward direction, the first region is adjacent to the tip, the second region is remote from the tip, wherein the boundary is defined by a perimeter of a planar cross-section of the back side, and wherein a diameter of the planar cross-section is substantially equal to a diameter of the table facet;
    arranging a first coating over all of the first region of the back surface, the first coating causing a first colour effect, and
    arranging a second coating over all of the second region of the back surface, the second coating causing a second colour effect that differs from the first colour effect.

10. The method of claim 9, wherein the step of arranging the first coating on the first region comprises steps of: covering the second region of the back surface with a mask, arranging the first coating on the back surface, and removing the mask from the second region of the back surface of the back side, such that the second region is free from the first coating; and wherein the step of arranging the second coating on the second region of the back surface comprises a step of: arranging the second coating on the entire back surface of the back side.

11. The method of claim 10, wherein the step of covering the second region of the back surface with a mask comprises: providing a mask having an aperture, and arranging the back side of the decorative element in the aperture such that the second region is shielded by the mask and the first region is exposed through the aperture; and wherein the step of arranging a first coating on the back surface of the back side comprises arranging the first coating on the decorative element on the exposed first region.

12. A method of making a plurality of decorative articles each with a changeable observed colour effect, wherein each article is made in accordance with the method of claim 11, wherein the mask comprises a plurality of apertures, and the method comprises arranging the back side of each of the plurality of decorative elements in a respective aperture of the mask such that each second region is shielded by the mask and each first region is exposed through the respective aperture.

* * * * *